United States Patent [19]

Aizawa

[11] Patent Number: 5,075,758
[45] Date of Patent: Dec. 24, 1991

[54] SEMICONDUCTOR DEVICE

[75] Inventor: Yoshiaki Aizawa, Machida, Japan

[73] Assignee: Kabushiki Kaisha Toshiba, Kawasaki, Japan

[21] Appl. No.: 558,513

[22] Filed: Jul. 27, 1990

[30] Foreign Application Priority Data

Jul. 31, 1989 [JP] Japan .................................. 1-198314

[51] Int. Cl.⁵ ............................................ H01L 23/48
[52] U.S. Cl. .................................. 357/70; 357/75
[58] Field of Search ................................ 357/70, 75

[56] References Cited

U.S. PATENT DOCUMENTS

| | | | |
|---|---|---|---|
| 3,602,983 | 9/1971 | Bertioli | 357/70 |
| 3,736,475 | 5/1973 | Berner | 357/75 |
| 3,896,473 | 7/1975 | DiLorenzo | 357/75 |
| 4,303,935 | 12/1981 | Ragaly | 357/79 |

Primary Examiner—Eugene R. Laroche
Assistant Examiner—R. Ratliff
Attorney, Agent, or Firm—Finnegan, Henderson, Farabow, Garrett, and Dunner

[57] ABSTRACT

A semiconductor device includes a plurality of lead frames on which at least one semiconductor pellet is formed, a dummy pellet on at least one of the plurality of lead frames, wires for connecting electrodes of the semiconductor pellets with electrodes of the dummy pellet.

11 Claims, 4 Drawing Sheets

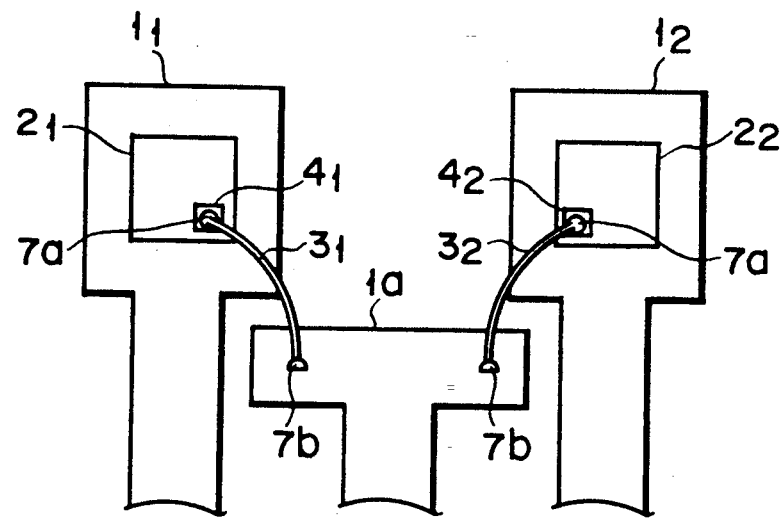
F I G. 1
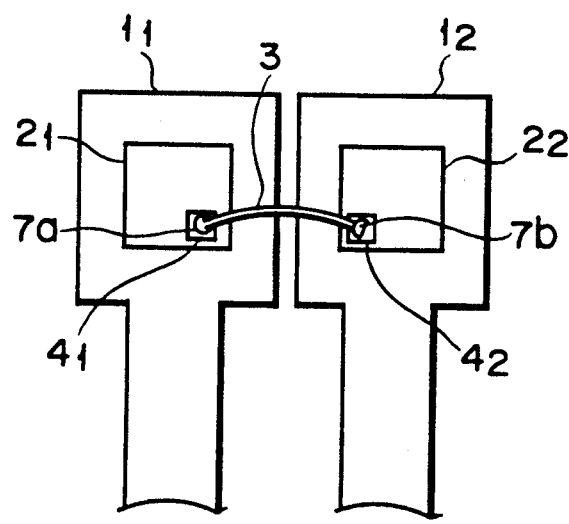
F I G. 2

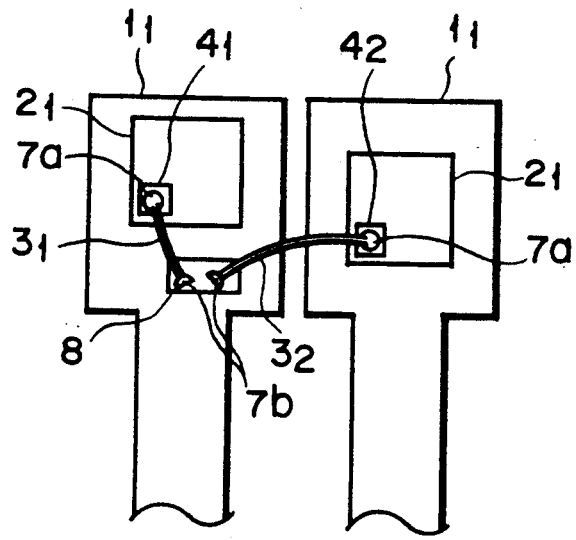
F I G. 3
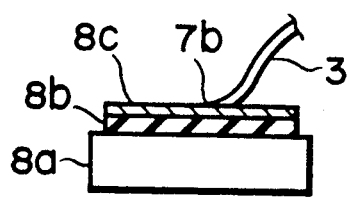
F I G. 4
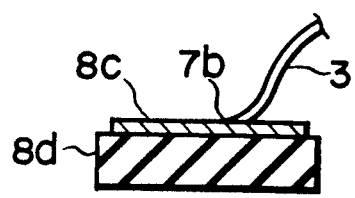
F I G. 5

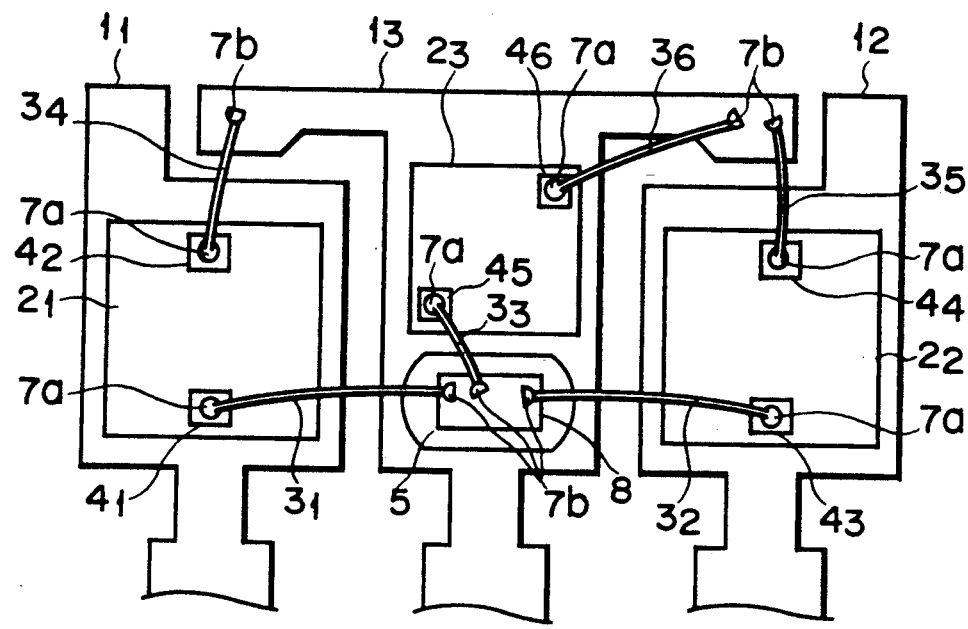
F I G. 6
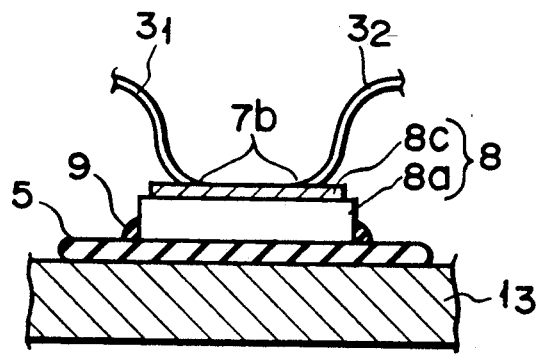
F I G. 7

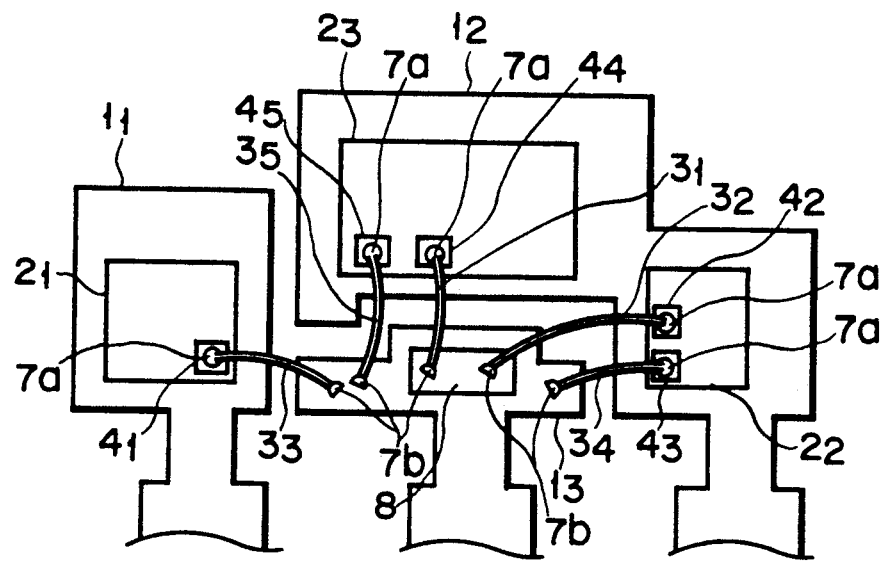
F I G. 8
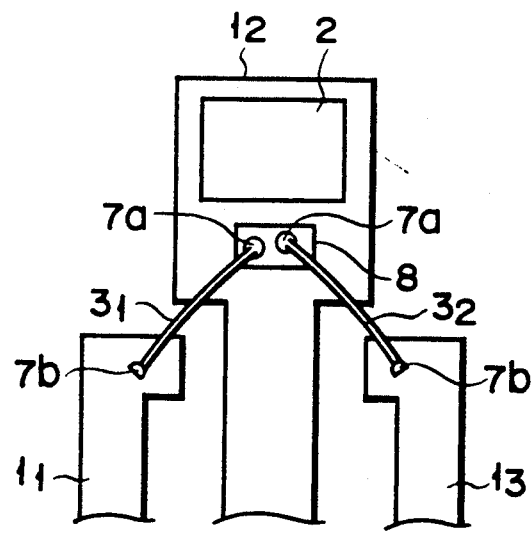
F I G. 9

SEMICONDUCTOR DEVICE

BACKGROUND OF THE INVENTION

1. Field of the Invention

The present invention relates to a semiconductor device and, more particularly, to a semiconductor device having a plurality of lead frames in which semiconductor pellets respectively mounted on the lead frames are wire-bonded to be electrically connected to each other.

2. Description of the Related Art

FIGS. 1 and 2 show a semiconductor device in which semiconductor pellets are mounted on a plurality of conventional lead frames and the semiconductor pellets are bonded to each other by wirings to be electrically connected. The same reference numerals in FIG. 1 denote the same parts as in FIG. 2.

A conventional device shown in FIG. 1 will be described below. Semiconductor pellets $2_1$ and $2_2$ are fixed on lead frames $1_1$ and $1_2$, respectively. Electrodes $4_1$ and $4_2$ made of aluminum are formed on the semiconductor pellets $2_1$ and $2_2$, respectively. The semiconductor pellets $2_1$ and $2_2$ are electrically connected to each other through a dummy lead $1a$ by two wires $3_1$ and $3_2$ made of gold.

The semiconductor pellets $4_1$ and $4_2$ are electrically connected to each other through the dummy lead $1a$ by the gold wires $3_1$ and $3_2$ due to the following reason.

That is, in a conventional device as shown in FIG. 2, when the aluminum electrodes $4_1$ and $4_2$ are directly connected by the gold wires 3, a portion of either aluminum electrode is necessarily wedge-bonded to the gold wire 3. In FIG. 2, the gold wire 3 is wedge-bonded to the aluminum electrode $4_2$. The wedge-bonded portion is represented by reference numeral $7b$, and a ball-bonded portion is represented by reference numeral $7a$. As described above, when the gold wire 3 and the aluminum electrode $4_2$, i.e., gold and aluminum, are wedge-bonded, the gold and aluminum are reacted with each other to form an alloy. In progress of alloying, cracks of the gold wire 3 occur and are grown, and the gold wire 3 is finally disconnected. This adversely affects reliability of the semiconductor device. These cracks occur due to the following reason. When the aluminum electrode $4_2$ is heated to a temperature of 200° C. to 300° C. and the gold wire 3 is bonded on the electrode $4_2$, the contact portion between the gold wire 3 and the electrode $4_2$ is alloyed.

The contact portion between the gold wire 3 and the electrode $4_2$ is to be thin. Therefore, the gold wire 3 is used for alloying, and the thickness of the contact portion is further decreased. Then, cracks occur due to a difference between expansion coefficients of the alloy portion and the gold wire 3. For this reason, in a conventional semiconductor device, as shown in FIG. 1, using the dummy lead $1a$ formed by plating an Ni-Fe alloy with silver, the gold wire 3 is wedge-bonded to the dummy lead $1a$, thereby electrically connecting the semiconductor pellets $2_1$ and $2_2$ by wire-bonding. That is, the amount of alloying in a portion $7b$ where gold is wedge-bonded to silver is less than it would be between gold and aluminum. The amount of gold of the wires $3_1$ and $3_2$ for alloying gold and silver is smaller than that for alloying aluminum and gold, and cracks of the wires are less likely to occur.

Note that, since the gold wire 3 is used at the ball-bonded portion $7a$ in its longitudinal direction, cracks do not occur.

However, in a conventional device shown in FIG. 1, since the dummy lead $1a$ is required, the number of pins of the semiconductor device is increased, thereby disadvantageously increasing the size of a package. Especially, in a semiconductor device in which the number of pins and the dimensions of a package are limited, the above conventional device is difficult to use.

A means for solving the above problem has been studied. For example, as a method of using a dummy lead without an increase in number of pins and dimension of a package, it is studied that when the dummy lead is formed within the defined pitch between the original pins, it is molded, and disconnected. However, in this method, this dummy lead is necessarily, locally exposed and left outside the mold. For this reason, surface leakage is increased to pose a problem on safety standards. In order to prevent exposure of the cut portion of the dummy lead outside the mold, a double mold in which the dummy lead is molded again after cutting it is considered. However, the double mold causes a semiconductor device to be large in size. Even when the mounting density of elements is increased without increasing the dimension of the semiconductor device, freedom of frame design is degraded, thereby increasing cost.

In addition, as a method not using a dummy lead, it is studied that gold is used as a material for an electrode formed on a semiconductor pellet. However, in this method, since the gold has a large diffusion coefficient, the gold is diffused in the semiconductor pellet. Therefore, the gold and silicon contained in the semiconductor pellet are reacted with each other, thereby changing characteristics of elements inside the pellet.

SUMMARY OF THE INVENTION

It is an object of the present invention to provide a semiconductor device wherein semiconductor pellets can be wire bonded to be electrically connected to each other without increasing the number of pins of the semiconductor device and the package size and without degrading reliability of the semiconductor device.

According the present invention, there is provided a semiconductor device comprising a plurality of lead frames on which at least one semiconductor pellet is fixed, wherein a dummy pellet connected to a bonding wire is fixed on at least one of the lead frames, and electrodes of the semiconductor pellet are wire-bonded to each other through an electrode of the dummy pellet.

In a semiconductor device with the above arrangement, since semiconductor pellets fixed on lead frames are wire-bonded to be electrically connected through a dummy pellet formed on the lead frames, wedge-bonding to an electrode of the semiconductor pellet can be avoided. Therefore, the electrode of the semiconductor pellet is always connected to a wire by ball-bonding. As a result, as a material for the electrode of the semiconductor pellet, a material which does not affect characteristics of an element can be selected regardless of a material for the wire. Reliability of elements formed in the semiconductor pellet is not degraded.

Although the electrode of the dummy pellet is always wedge-bonded to be connected to the wire, since no element concerning operation of the semiconductor device is formed on the dummy pellet, a material which is less likely to be alloyed with the wire material can be selected as a material for the electrode. For example, the same material as the material for the wire can be used as the electrode material As a result, degradation of reliability of the wire caused by alloying the wire material and the electrode material due to wedge-bonding, and more specifically, degradation of reliability concerning disconnection caused by forming and growing cracks can be prevented.

In addition, as a position for fixing the dummy pellet, a lead frame on which at least one semiconductor pellet or a lead frame used as an electrode is used. Therefore, since a new lead frame need not be formed, i.e., the number of pins is not increased, the package size of the semiconductor device is not increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1 and 2 are plan views showing a conventional semiconductor device;

FIG. 3 is a plan view showing a semiconductor device according to the first embodiment of the present invention;

FIGS. 4 and 5 are views showing a sectional structure of a dummy pellet in FIG. 3;

FIG. 6 is a plan view showing a semiconductor device according to the second embodiment of the present invention;

FIG. 7 is a view showing a sectional structure of a dummy pellet in FIG. 6;

FIG. 8 is a plan view showing a semiconductor device according to the third embodiment of the present invention; and FIG. 9 is a plan view showing a semiconductor device according to the fourth embodiment of the present invention.

DETAILED DESCRIPTION OF THE PREFERRED EMBODIMENT

A semiconductor device according to an embodiment of the present invention will be described below with reference to the accompanying drawings.

FIG. 3 is a plan view showing a semiconductor device according to the first embodiment of the present invention emphasizing a lead frame portion.

As shown in FIG. 3, semiconductor pellets $2_1$ and $2_2$ are fixed on lead frames $1_1$ and $1_2$, respectively. As a material for the lead frame 1, for example, an Ni-Fe alloy is plated with silver is used. Electrodes $4_1$ and $4_2$ made of, e.g., aluminum are on the semiconductor pellets $2_1$ and $2_2$. In addition, a dummy pellet 8 is fixed on the lead frame $1_1$.

The semiconductor pellets $2_1$ and $2_2$ are electrically connected to each other by two wires $3_1$ and $3_2$ made of, e.g., gold through the dummy pellet 8. In this case, when the gold wires $3_1$ and $3_2$ are to be wire-bonded, the wires are always ball-bonded to the electrodes $4_1$ and $4_2$ made of, e.g., aluminum and formed on the semiconductor pellets $2_1$ and $2_2$ (this ball-bonded portions are represented by reference numeral $7a$ shown in FIG. 3). On the other hand, the wires are always wedge-bonded to gold electrodes (not shown in FIG. 1) formed on the dummy pellet 8 (this wedge-bonded portions are represented by reference numeral $7b$ shown in FIG. 3).

As described above, in the first embodiment, the gold wires $3_1$ and $3_2$ are ball-bonded to the electrodes $4_1$ and $4_2$ of the semiconductor pellets $2_1$ and $2_2$ having elements and are wedge-bonded to the electrodes of the dummy pellet 8 having no element. As a result, as a material for the electrodes $4_1$ and $4_2$ of the semiconductor pellets $2_1$ and $2_2$, a material which slightly affects an element can be selected regardless of a material for the wires $3_1$ and $3_2$. For example, since the electrode material in the first embodiment is aluminum, reliability of each element formed in the semiconductor pellets $2_1$ and $2_2$ is not degraded.

As a material for the electrode of the dummy pellet 8, gold which is a material for the wires $3_1$ and $3_2$ can be used. For example, as the wire material in the first embodiment, gold is usually used. The electrode of the dummy pellet 8 is made of gold. Thus, since the wires $3_1$ and $3_2$ and the electrodes of the dummy pellet 8 are constituted by the same material, degradation of reliability of the wire caused by alloying the wire material and the electrode material due to wedge-bonding, and more specifically, degradation of reliability concerning disconnection caused by forming and growing cracks can be prevented, thereby improving the reliability of the wire. As a material for the dummy pellet 8, a material which is resistant to alloying with the wire material even when the wires $3_1$ and $3_2$ are wedge-bonded can be selected. For example, as a material for the electrode of the dummy pellet 8, a material for the lead frame 1, i.e., a nickel-iron alloy plated with silver may be used.

In the above first embodiment, the dummy pellet 8 is the lead frame $1_1$ on which the semiconductor pellet $2_1$ is fixed. Therefore, since a conventional dummy lead need not be provided, a new lead frame is not required, i.e., the number of pins is not increased. The package size of the semiconductor device is not increased.

FIGS. 4 and 5 show sectional structures of the dummy pellet 8.

FIG. 4 shows the first sectional structure of the dummy pellet 8. For example, as an insulator, a silicon oxide film $8b$ is on a substrate $8a$ made of, e.g., silicon. An electrode $8c$ is on the silicon oxide film $8b$. The silicon oxide film $8b$ electrically insulates the electrode $8c$ from the lead frame when the dummy pellet is fixed on the lead frame. The wire 3 is connected on the electrode $8c$ in a wedge-bonded state (represented by reference numeral $7b$ shown in FIG. 4). In this case, as a material for the electrode $8c$, a material which is hard to be alloyed with the material of the wire 3 or the same material as the wire 3 is selected. For example, when the material for the wire 3 is gold, as the material for the electrode $8c$, silver, gold, or the like is used.

A process of forming the dummy pellet having the first sectional structure will be described below. The silicon oxide film $8b$ is formed on the silicon substrate $8a$, and silver or gold serving as the electrode $8c$ is deposited on the upper surface of the oxide film $8b$. Therefore, this dummy pellet can be easily formed by a conventional semiconductor manufacturing apparatus, and new investment is not required. Furthermore, since silicon is used as a main material, the production cost of the dummy pellet 8 is relatively low. In addition, unaccepted defective silicon wafer may be cut into the silicon substrate $8a$, and a silicon wafer can be effectively used without any waste.

In the first sectional structure, when gold is used as the material of the wire 3, gold is desirably used as a material for the electrode $8c$. This is because gold has workability better than silver, and the material of the wire 3 is gold. Since the electrode $8c$ and the wire 3 are constituted by the same material, occurrence of cracks can be prevented upon bonding of the wire 3 with the electrode $8c$, thereby improving reliability of the wire.

FIG. 5 is a view showing the second sectional structure of the dummy pellet 8. As shown in FIG. 5, the electrode $8c$ is directly formed on an insulating substrate $8d$ made of an insulator. The electrode $8c$ is electrically insulated from the lead frame by the insulating substrate $8d$ when the dummy pellet is fixed on the lead frame. In the second sectional structure, the wire 3 is connected on the electrode $8c$ in a wedge-bonded state (represented by reference numeral $7b$ shown in FIG. 5). In this case, as materials for the wire 3 and the electrode $8c$, materials which are hard to be alloyed with the wire material or the same material are selected as in the first sectional structure. For example, when a material for the wire 3 is gold, silver, gold, or the like is used as a material for the electrode $8c$.

In the second structure, when a material for the wire 3 is gold, gold is desirable as a material for the electrode $8c$.

The second embodiment of a semiconductor device according to the present invention will be described below with reference to FIG. 6.

FIG. 6 is a plan view showing a semiconductor device according to the second embodiment of the present invention emphasizing a lead frame portion. The same reference numeral in FIG. 3 denote the same parts as in FIG. 6.

As shown in FIG. 6, semiconductor pellets $2_1$, $2_2$, and $2_3$ are fixed on the lead frames $1_1$, $1_2$, and $1_3$, respectively. As a material for the lead frames 1, for example, an Ni-Fe alloy plated with silver is used. Electrodes $4_1$ to $4_6$ made of, e.g., aluminum are formed on the semiconductor pellets $2_1$, $2_2$, and $2_3$. In addition, a dummy pellet 8 is fixed on the lead frame $1_3$ through a insulator 5.

The semiconductor pellets $2_1$, $2_2$, and $2_3$ are electrically connected to each other by the following two means.

According to the first means, the other end of each of the wires $3_1$, $3_2$, and $3_3$ made of, e.g., gold, one end of which is fixed to a corresponding one of the semiconductor pellets $2_1$, $2_2$, and $2_3$, is connected to the dummy pellet 8 fixed on the lead frame $1_3$, and the semiconductor pellets $2_1$, $2_2$, and $2_3$ are connected to each other through the dummy pellet 8.

According to the second means, the other end of each of the wires $3_4$, $3_5$, and $3_6$ made of, e.g., gold, one end of which is fixed to a corresponding one of the semiconductor pellets $2_1$, $2_2$, and $2_3$, is connected to the lead frame $1_3$, and the semiconductor pellets $2_1$, $2_2$, and $2_3$ are connected to each other through the lead frame $1_3$.

According to the first embodiment, for example, when the gold to be wires $3_1$ to $3_3$ are to be wire-bonded, the gold wires $3_1$ to $3_3$ are always ball-bonded to the electrodes $4_1$, $4_3$, and $4_5$ made of aluminum (the ball-bonded portion is represented by reference numeral $7a$ in FIG. 6). The wires are always wedge-bonded to electrodes (not shown in FIG. 6) on the dummy pellet 8 (the wedge-bonded portion is represented by reference numeral $7b$ in FIG. 6). According to the second embodiment, for example, when the gold wires $3_4$ to $3_6$ are to be wire-bonded, the gold wires are always ball-bonded to the electrodes $4_2$, $4_4$, and $4_6$ made of, e.g., aluminum (the ball-bonded portion is represented by reference numeral $7a$ in FIG. 6). The gold wires $3_4$, $3_5$, and $3_6$ are always wedge-bonded to the lead frame $1_3$ (the wedge-bonded portion is represented by reference numeral $7b$ in FIG. 6).

As described above, in the second embodiment of the present invention shown in FIG. 6, the wires $3_1$ to $3_6$ are always bonded to the electrodes $4_1$ to $4_6$ of the semiconductor pellets $2_1$ to $2_3$ having elements concerning the semiconductor device operation in the state of the ball-bonded portion $7a$. The wires $3_1$ to $3_6$ are always bonded to the electrodes of the dummy pellet 8 having no element concerning the semiconductor device operation and to the lead frame $1_3$ in the state of the wedge-bonded portion $7b$. As a result, as in the first embodiment, reliability of each element formed in the semiconductor pellets $2_1$ to $2_3$ is not degraded, and reliability of the wires $3_1$ to $3_6$ is not degraded either.

As a position for fixing the dummy pellet 8 in the second embodiment, the lead frame $1_3$ on which the semiconductor pellet $2_3$ is fixed is used. For this reason, a dummy lead formed in the conventional structure need not be formed. In addition, upon formation of the above lead frame $1_3$, predetermined notches are formed in the lead frames $1_1$ and $1_2$ as shown in FIG. 6. When the above lead frame $1_3$ is formed such that the lead frame $1_3$ is partially fitted in the notches, the lead frame area in the plan view can be effectively utilized. More particularly, the area of an inner lead region serving as a frame portion sealed by a mold can be effectively utilized. Therefore, an increase in package size of the semiconductor device can be prevented, and the lead frame $1_3$ can be easily wire-bonded to the semiconductor pellets $2_1$ and $2_2$ respectively fixed on the lead frames $1_1$ and $1_2$.

The third sectional structure of the dummy pellet 8 will be described below with reference to FIG. 7.

FIG. 7 is a sectional view of region where the dummy pellet 8 of the lead frame $1_3$ shown in FIG. 6 is fixed. As shown in FIG. 6, a region, at least one part of which is covered by the insulator 5, is present on the lead frame $1_3$. A substrate $8a$ made of, e.g., silicon is adhered to the insulator 5 by, e.g., an insulating paste 9. When an insulator such as the insulator 5 is used as an underlying layer, a conductive paste may be used as the paste 9. An electrode $8c$ is formed on the substrate $8a$. In this case, the electrode $8c$ and the substrate $8a$ are set at the same potential. The dummy pellet 8 formed as described above is electrically insulated from the lead frame $1_3$ by the insulator 5 and the insulating paste 9. Wires $3_1$ and $3_2$ are connected to the electrode $8c$ in a wedge-bonded state (represented by reference numeral $7b$ shown in FIG. 7). In this case, as a material for the electrode $8c$, a material which is hard to be alloyed with the wire material or the same material as the wire material is selected. For example, when a material for the wire 3 is gold, as a material for the electrode $8c$, silver or gold is used.

As a feature of the above third sectional structure, since the lead frame $1_3$ is insulated from the dummy pellet 8 by the insulator 5, it is necessary to insulate the substrate $8a$ from the electrode $8c$. Therefore, selectivity of the material for the substrate $8a$ is improved.

In the case of the third sectional structure, when the material for the wire 3 is gold as a material for the electrode $8c$, gold is further desirably used.

A semiconductor device according to the third embodiment will be described below with reference to FIG. 8.

FIG. 8 is a plan view showing a semiconductor device according to the third preferred embodiment of the present invention emphasizing a lead frame portion. The same reference numerals in FIG. 8 denote the same parts as in FIG. 3.

As shown in FIG. 8, a semiconductor pellet $2_1$ is fixed on a first lead frame $1_1$, and semiconductor pellets $2_1$ and $2_3$ are fixed on a second lead frame $1_2$. Electrodes $4_1$ to $4_5$ made of, e.g., aluminum are on the semiconductor pellets $2_1$ to $2_3$. The third lead frame $1_3$ is a lead frame used as an electrode for supplying a predetermined potential. A dummy pellet 8 is fixed on the third lead frame $1_3$. As a material for the first to third lead frames $1_1$ to $1_3$, an Ni-Fe alloy or the like plated with silver is used, as in the first and second embodiments.

The above semiconductor pellets $2_2$ and $2_3$ are electrically connected by two wires $3_1$ and $3_2$ made of, e.g., gold through the dummy pellet 8 fixed on the lead frame $1_3$ used as an electrode. Wires $3_3$ to $3_5$ made of, e.g., gold are directly wedge-bonded to the third lead frame $1_3$ and serve as wires for supplying a predetermined potential to the semiconductor pellets $2_1$ to $2_3$.

In the above case, when, e.g., the gold wires $3_1$ and $3_2$ for electrically connecting the semiconductor pellet $2_2$ with the semiconductor pellet $2_3$ are wire-bonded, the wires are always ball-bonded to the electrodes $4_2$ and $4_5$ made of, e.g., aluminum, as in the first and second embodiments (the ball-bonded portions are represented by reference numeral $7a$ in FIG. 8). The wires are always wedge-bonded to electrodes (not shown in FIG. 8) formed on the dummy pellet 8 (the wedge-bonded portions are represented by reference numeral $7b$ in FIG. 8). When, e.g., the gold wires $3_3$ and $3_5$ for supplying a predetermined potential to the semiconductor pellets $2_1$ to $2_3$ are wire-bonded, the wires are always ball-bonded to the electrodes $4_1$, $4_3$, and $4_5$ (the ball-bonded portions are represented by reference numeral $7a$ in FIG. 8). The wires are always wedge-bonded to the lead frame $1_3$ (the wedge-bonded portions are represented by reference numeral $7b$ in FIG. 8).

As described above, in the third embodiment, the wires $3_1$ to $3_5$ are always bonded to the electrodes $4_1$ to $4_5$ of the semiconductor pellets $2_1$ to $2_3$ having elements concerning the operation of the semiconductor device with a state of the ball-bonded portion $7a$. In addition, the wires $3_1$ to $3_5$ are always bonded to the electrodes of the dummy pellet 8 having an element concerning the operation of the semiconductor device and the lead frame $1_3$ in a state of the wedge-bonded portion $7b$. As a result, as in the first and second embodiments, reliability of each element formed in the semiconductor pellets $2_1$ to $2_3$ is not degraded, and reliability of the wires $3_1$ to $3_5$ is not degraded either.

In the third embodiment, as a position where the dummy pellet 8 is fixed, the second lead frame $1_3$ applied with a predetermined potential and serving as an electrode is used. That is, a new dummy lead formed in the conventional structure need not be formed. In addition, when the lead frame $1_3$ is formed, the lead frame $1_3$ is smaller than the other lead frames $1_1$ and $1_2$ located adjacent to the lead frame $1_3$ in advance, as shown in FIG. 8. Since the lead frame $1_3$ is formed to be small, other lead frames $1_1$ and $1_2$ can be arranged such that the lead frame $1_2$ is partially fit in a region where the lead frames $1_1$ and $1_2$ are defined and are not present. A lead frame area in the plan view can be effectively used, and more particularly, the area of an inner lead region can be small. Therefore, an unexpected increase in package size of the semiconductor device can be prevented, and the lead frame $1_3$ can be easily wire-bonded to the semiconductor pellets $2_1$ to $2_3$ respectively fixed on the lead frames $1_1$ and $1_2$.

Note that a means for electrically connecting semiconductor pellets with each other as described in the third embodiment may be combined with the electrically connecting means as described in the first and second embodiments on a single semiconductor package, as a matter of course.

As a sectional structure of the dummy pellet 8, for example, the first to third sectional structures as described above may be used. Since the first to third sectional structures are selectively used as the sectional structure of the dummy pellet 8, the lead frame $1_3$ applied with a predetermined potential can be electrically insulated from the electrode on the dummy pellet 8. As a result, regardless of the potential of the lead frame $1_3$, the semiconductor pellets $2_2$ and $2_3$ can be wire-bonded to be electrically connected to each other through the dummy pellet 8.

A semiconductor device according to an application of the present invention will be described with reference to FIG. 9.

FIG. 9 is a plan view showing a semiconductor device according to the fourth embodiment of the present invention emphasizing a lead frame portion. The same reference numerals in FIG. 9 denote the same parts as in FIG. 3.

As shown in FIG. 9, a semiconductor pellet 2 is fixed on a central lead frame $1_2$ of three lead frames $1_1$, $1_2$, and $1_3$. A dummy pellet 8 is fixed on the lead frame $1_2$. A predetermined first potential is applied to the lead frame $1_2$. The lead frames $1_1$ and $1_3$ are located adjacent to the lead frame $1_2$, and a predetermined second potential different from the first potential is applied to the lead frame $1_1$.

In the above state, the lead frames $1_1$ to $1_3$ are arranged. In order to transmit the second potential of the lead frame $1_1$ to the lead frame $1_3$ applied with the first potential and interposed between the lead frames $1_1$ and $1_3$, the lead frames $1_1$ and $1_3$ are connected to have the same potential by wires $3_1$ and $3_2$ through the dummy pellet 8.

In a semiconductor device as shown in FIG. 9, the lead frames $1_1$ and $1_3$ interposing the lead frame $1_2$ therebetween are connected by the wires $3_1$ and $3_2$ through the dummy pellet fixed on the lead frame $1_2$. That is, lead frames applied with different potentials are not connected through wires. As a result, the lead frame $1_1$ applied with the second potential and the lead frame $1_3$ interposing the lead frame $1_2$ applied with the first potential can be electrically connected to each other while reducing probability of a short circuit.

As the structure of the dummy pellet used in the semiconductor device shown in FIG. 9, the same structure as the first to third sectional structures may be used. Note that a material for the electrode of the dummy pellet 8 is not required to be limited to a material which is resistant to alloying with a material for the wire 3.

This is because the portions 7b where the wires $3_1$ and $3_2$ are wedge-bonded are respectively on the lead frames $1_1$ and $1_3$, and because the portions 7a where the wires are ball-bonded are formed on the electrodes of the dummy pellet 8, as shown in FIG. 9.

In a semiconductor device according to the present invention, materials for a wire and an electrode are not limited to the above gold, silver, or aluminum. Various materials can be used. In this case, in the first to third embodiments, as a material for a dummy pellet, a material which is resistant to alloying with a material for the wire is selected, as a matter of course.

A material for a substrate consisting of a dummy pellet is not limited to silicon or the like, and a conductor except for silicon or an insulator may be used.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A semiconductor device comprising:
    a plurality of lead frames;
    a plurality of semiconductor pellets, each pellet fixed on a respective one of the lead frames and having an electrode;
    a dummy pellet fixed on one of said plurality of lead frames, said dummy pellet being electrically insulated from said one of the plurality of lead frames and having an electrode; and
    wires for connecting electrodes of said semiconductor pellets to the electrode of said dummy pellet including
        a first wire coupled between a first electrode of one of the semiconductor pellets and the electrode of the dummy pellet; and
        a second wire coupled between a second electrode of one of the semiconductor pellets and the electrode of the dummy pellet.

2. A semiconductor device according to claim 1, wherein a material for said wires is the same as a material for said electrode of said dummy pellet.

3. A semiconductor device according to claim 1, wherein a material for said wires and said electrode of said dummy pellet is gold.

4. A semiconductor device according to claim 1, wherein said wires are ball-bonded to said electrodes of said semiconductor pellets and wedge-bonded to said electrode of said dummy pellet.

5. A semiconductor device comprising:
    a plurality of lead frames;
    a plurality of semiconductor pellets, each pellet fixed on a respective one of the lead frames and having electrodes;
    an additional lead frame;
    a dummy pellet mechanically coupled to the additional lead frame, insulated from the additional lead frame, and having an electrode;
    a first plurality of wires coupled between electrodes of said semiconductor pellets and the electrode of said dummy pellet; and
    a second plurality of wires coupled between electrodes of said semiconductor pellets and said additional lead frame.

6. A semiconductor device according to claim 5, wherein said dummy pellet is electrically isolated from said additional lead frame.

7. A semiconductor device according to claim 5, wherein a material for said wires is the same as a material for said electrode of said dummy pellet.

8. A semiconductor device according to claim 7, wherein a material for said wires and a material for said electrode of said dummy pellet is gold.

9. A semiconductor device according to claim 5, wherein first ends of said first plurality of wires are respectively ball-bonded to said electrodes of said semiconductor pellets and second ends of said first plurality of wires are wedge-bonded to said electrode of said dummy pellet, first ends of said second plurality of wires are ball-bonded to said electrodes on said semiconductor pellets and second ends of said second plurality of wires are wedge-bonded to electrodes on said lead frame.

10. A semiconductor device having a plurality of lead frames, comprising:
    a first lead frame;
    a second lead frame;
    a semiconductor pellet on said second lead frame;
    a dummy pellet on said second lead frame and electrically isolated from said second lead frame; and
    a third lead frame opposite to said first lead frame with respect to said second lead frame,
    wherein said first and third lead frames are electrically connected to each other by first and second wires through said dummy pellet on said second lead frame.

11. The semiconductor device of claim 1, wherein the first electrode is on one of the semiconductor pellets and the second electrode is on a different one of the semiconductor pellets.

* * * * *